United States Patent
Jain et al.

(10) Patent No.: US 7,421,370 B2
(45) Date of Patent: Sep. 2, 2008

(54) METHOD AND APPARATUS FOR MEASURING A CHARACTERISTIC OF A SAMPLE FEATURE

(75) Inventors: Rohit Jain, Ventura, CA (US); John Richards, Solvang, CA (US)

(73) Assignee: Veeco Instruments Inc., Woodbury, NY (US)

( * ) Notice: Subject to any disclaimer, the term of this patent is extended or adjusted under 35 U.S.C. 154(b) by 0 days.

(21) Appl. No.: 11/228,957

(22) Filed: Sep. 16, 2005

(65) Prior Publication Data

US 2007/0067140 A1    Mar. 22, 2007

(51) Int. Cl.
G06F 15/00    (2006.01)
G01B 5/02    (2006.01)

(52) U.S. Cl. .................... 702/172; 73/105; 73/850; 250/307

(58) Field of Classification Search ............... 702/168, 702/172; 73/105, 850, 852; 250/307
See application file for complete search history.

(56) References Cited

U.S. PATENT DOCUMENTS

| | | | |
|---|---|---|---|
| 5,226,801 A | | 7/1993 | Cobile |
| RE34,489 E | | 12/1993 | Hansma et al. |
| 5,412,980 A | | 5/1995 | Elings et al. |
| 5,644,512 A | * | 7/1997 | Chernoff et al. ............... 702/85 |
| 5,825,670 A | * | 10/1998 | Chernoff et al. ............... 702/85 |
| 6,388,252 B1 | * | 5/2002 | Takahashi et al. ............ 250/306 |
| 6,873,747 B2 | * | 3/2005 | Askary ....................... 382/295 |
| 7,067,806 B2 | * | 6/2006 | Watanabe et al. ............. 250/306 |
| 7,143,005 B2 | * | 11/2006 | Dahlen et al. ................. 702/168 |
| 2005/0043917 A1 | * | 2/2005 | Dahlen et al. ................. 702/168 |

FOREIGN PATENT DOCUMENTS

JP        07222192 A  *  8/1995

OTHER PUBLICATIONS

Balk et al., 'Thermal Analysis by Means of Scanning Probe Microscopy', 1997, IEEE Publication, pp. 1-6.*
Shen et al., 'Couple Passive Voltage Contrast with Scanning Probe Microscope to Identify Invisible Defect Out', May 2005, pp. 290-293.*

(Continued)

Primary Examiner—Edward Raymond
Assistant Examiner—Elias Desta
(74) Attorney, Agent, or Firm—Boyle Fredrickson S.C.

(57) ABSTRACT

A scanning probe microscope (SPM) based measuring technique for measuring surface features of a sample fits a curve to a family of feature edge points acquired as a result of an SPM scan of the surface feature. If two curves are fit on opposed edges of the feature of interest, the maximum or minimum distance between those curves can be determined to ascertain a dimension of interest such as a maximum via width, a minimum line width, etc. The scan is preferably a relatively low-resolution scan in the Y direction, typically having 8-12 scan profiles passing through the feature of interest low-resolution, which is about half that typically used by prior techniques. The low-resolution scan can be performed relatively rapidly and with high repeatability. Repeatability is also higher than with prior techniques, and the level of repeatability is relatively insensitive to the resolution in the Y direction. Using a low-resolution scan also significantly reduces tip wear and increases throughput when compared to high-resolution scans.

26 Claims, 5 Drawing Sheets

OTHER PUBLICATIONS

Katagiri et al., 'Scanning-probe Microscope Using an Ultrasmall Coupled-Cavity Laser Distortion Sensor Based on Mechanical Negative-Feedback Stabilization', 1998, IOP Publication, pp. 1441-1445.*

Yen, 'A Qualitative Profile-Based Approach to Edge Detection', Sep. 2003, PhD Dissertation, New York University, pp. 1-135.*

Via Analysis, Description of Veeco Instruments, Inc. XSM Software, undated.

J.C. Russ, *Segmentation and Thresholding,* The Image Processing Handbook, Third Edition, pp. 371-429, (Undated), CRC Handbook published in cooperation with IEE Press.

* cited by examiner

METHOD AND APPARATUS FOR MEASURING A CHARACTERISTIC OF A SAMPLE FEATURE

BACKGROUND OF THE INVENTION

1. Field of the Invention

The present invention is directed to probe-based instruments and, more particularly, relates to a scanning probe microscope (SPM) based method and apparatus for facilitating high speed measurements of a characteristic of a sample feature, such as the maximum width of a semiconductor via, a minimum width of a semiconductor line, or the roughness of a semiconductor line edge.

2. Description of Related Art

Several probe-based instruments monitor the interaction between a cantilever-based probe and a sample to obtain information concerning one or more characteristics of the sample. For example, scanning probe microscopes (SPMs) typically characterize the surface of a sample down to atomic dimensions by monitoring the interaction between the sample and a tip on the cantilever probe. By providing relative scanning movement between the tip and the sample, surface characteristic data can be acquired over a particular region of the sample, and a corresponding map of the sample can be generated.

The atomic force microscope (AFM) is a very popular type of SPM. The probe of the typical AFM includes a very small cantilever which is fixed to a support at its base and which has a sharp probe tip attached to the opposite, free end. The probe tip is brought very near to or into contact with a surface of a sample to be examined, and the deflection of the cantilever in response to the probe tip's interaction with the sample is measured with an extremely sensitive deflection detector, often an optical lever system such as described in Hansma et al. U.S. Pat. No. RE 34,489, or some other deflection detector such as strain gauges, capacitance sensors, etc. The probe is scanned over a surface using a high-resolution three axis scanner acting on the sample support and/or the probe. The instrument is thus capable of creating relative motion between the probe and the sample while measuring the topography, elasticity, or some other surface property of the sample as described, e.g., in Hansma et al. U.S. Pat. No. RE 34,489; Elings et al. U.S. Pat. No. 5,226,801; and Elings et al. U.S. Pat. No. 5,412,980.

AFMs may be designed to operate in a variety of modes, including contact mode and oscillating mode. In contact mode operation, the microscope typically scans the tip across the surface of the sample while keeping the force of the tip on the surface of the sample generally constant. This effect is accomplished by moving either the sample or the probe assembly vertically to the surface of the sample in response to sensed deflection of the cantilever as the probe is scanned horizontally across the surface. In this way, the data associated with this vertical motion can be stored and then used to construct an image of the sample surface corresponding to the sample characteristic being measured, e.g., surface topography. Alternatively, some AFMs can at least selectively operate in an oscillation mode of operation such as TappingMode™ (TappingMode is a trademark of Veeco Instruments, Inc.) operation. In TappingMode™ operation the tip is oscillated at or near a resonant frequency of the cantilever of the probe. The amplitude or phase of this oscillation is kept constant during scanning using feedback signals, which are generated in response to tip-sample interaction. As in contact mode, these feedback signals are then collected, stored, and used as data to characterize the sample. The probe is moved at a fixed speed over the sample to collect a set number, e.g., 512, of data points per line, hence dividing the line into 511 equally spaced regions. Each data point represents an average height in that region.

Another form of oscillating mode operation, known as Critical Dimension mode or simple "CD" mode, distributes data acquisition along a scan profile so as to maximize data acquisition points in areas of changing topography. The scan rate is not constant as in TappingMode because the scanner instead adapts itself to the topography of the sample surface. The regions between the data points therefore are not equally spaced but, instead, are more heavily distributed over areas of the changing topography. For example, of 500 data points taken along a scan profile, 300 data points may be taken over one-fourth of the total length of that line. As a result, the actual height is determined in critical regions of the sample as opposed to simply determining an average height over the entire region.

AFMs and other SPMs are being used with increasing frequency for measuring characteristics of features of semiconductor devices and other devices with high accuracy and repeatability. For example, several operational characteristics of a semiconductor wafer are dependent upon the extreme dimensions of features formed on or in the wafer's surface. Semiconductor device manufacturers demand that these characteristics be known with a high degree of precision. These characteristics include, but are not limited to "extreme dimensions" such as the maximum widths of vias and trenches and the minimum widths of lines. A line is a semiconductor structure expanding upwardly substantially perpendicular to the top surface of the wafer. A trench is an elongated depression etched into or otherwise formed in a dielectric surface of a wafer. Trenches are often filled with trench capacitors. A "via" is a hole which is etched or otherwise formed in the interlayer dielectric of a wafer. It may be filled with a conducting material, such as metal, to allow for the electrical connection of several layers on the semiconductor, typically either tungston or copper.

Via metrology in semiconductor processing is important for the development and production of fast, efficient integrated circuits (ICs). For instance, the critical dimensions of vias are intimately related to chip speed. Chip speed is proportional to the rate at which switches are able to change between "on" and "off" states. This switching speed is inversely proportional to it's circuit's time constant, RC where C is the capacitance of the semiconductor device that is switching states and R is the resistance of the via that is permitting the dissipation of charge stored in that capacitor and is inversely proportional to the vias cross sectional area. This resistance is also intimately tied to the continuity of the conductive material that will fill the via. When the sidewalls of the via are sloped, voids and defects are more likely to occur during the fill process, causing higher resistance along the via, if not breaking conductivity all together, thus reducing device/chip speed. Thus, in order to develop fast, efficient ICs, knowledge of top, middle and bottom via widths is helpful for optimizing device, circuit and chip performance.

A semiconductor via V is shown somewhat schematically in greater detail in FIG. 1A-1C. It is generally in the shape of a truncated hemisphere, having a maximum depth $D_{max}$ near its center. At any given location along the depth of the via V, it will also have a maximum width $W_{max}$. Three maximum widths $W_{maxtop}$, $W_{maxmiddle}$, and $W_{maxbottom}$ are illustrated in FIGS. 1B and 1C by way of example in the upper, central, and lower regions of the via. Techniques have been proposed to measure extreme dimensions of semiconductor characteristics such as a via's maximum width using an AFM. However, these techniques have proven less than optimal.

For instance, in one approach utilized by the SXM software incorporated into some AFMs available from Veeco Instruments Inc., a high-resolution scan is taken over an area of the semiconductor surface containing the feature of interest. As is typical with such scans, data is obtained by moving the probe back and forth relative to the sample in a primary or X direction while incrementing the probe relative to the sample in the Y direction between passes in the X direction. The resultant scan secures data along profiles P or lines "L" in the X direction, with the adjacent lines being separated by a gap $\Delta Y_{INC}$ in the Y direction as is seen in FIG. 2A. The length of each scan line, spacing between adjacent scan lines, and number of scan lines are user-defined. The length and height of the scan may range from considerably less than 1 micron to 4 microns or more. The resolution of the data is dependent in part upon the length of the increments $\Delta Y_{INC}$ or stated another way, of the density of the scan in the Y direction. High-resolution scans in CD mode typically involve 35-60 scan lines per micron, typically resulting in the acquisition of 16-32 scan lines passing through the feature of interest. After taking such a high-resolution scan through the feature of interest, the software simply selects the scan line having the greatest or smallest length in the X direction as the maximum or minimum length of the feature of interest. Once such line is designation $L_{MAX\,APP}$ in FIG. 2A.

The technique described above is relatively time consuming because it requires a high-resolution scan. It also leads to relatively rapid tip wear—an important consideration where AFM tips are employed that may cost $1,000 or more. Perhaps somewhat counterintuitively, the repeatability is also relatively poor even at high-resolution. The reasons for this characteristic can be appreciated with reference to FIG. 2B. That figure shows a portion of a sidewall edge of the via V of FIG. 2A that includes the point $P_{ACT}$ at which the line $L_{MAX\,ACT}$ of greatest maximum length actually passes. The line $L_{MAX\,ACT}$ lies between the line $L_{MAX\,APP}$ that is identified by software as the line of maximum length and the next adjacent line, resulting in an offset $\Delta Y$ between $L_{MAX\,ACT}$ and $L_{MAX\,APP}$. The likely magnitude of the offset $\Delta Y$, as reflected by reduced repeatability, is inversely related to the resolution of the scan. Hence, while some users may adopt a scan density of as little as 4 scan lines passing through the feature of interest to maximize throughput, the repeatability of the resulting measurement is extremely poor. In addition, noise in the measurement resulting from scanner hysteresis and other factors may result in the acquisition of data on an apparent surface $S_{APP}$ that deviates from the actual surface $S_{ACT}$, resulting in the determination of an apparent end point $P_{APP}$ of the line $L_{MAX\,APP}$ that is offset from the actual point $P_{ACT}$ on the actual surface $S_{APP}$ by a factor $\Delta X$. The offset $\Delta Y$ could be reduced by increasing resolution still further (at the cost of reduced speed and increased tip wear), but the offset $\Delta X$ could be the same or even worse. Indeed, the increased measurement period required for high-resolution scans reduces accuracy because temperature changes and other environmental variations that occur over time can lead to increased measurement variations.

Another technique, proposed by IBM, attempts to determine the maximum width of a via or similar sample feature by obtaining a high-resolution scan as described above and then interpolating the measured width between scan lines to obtain the location of the actual longest scan line as opposed to simply selecting a scanned line. However, this technique, like the technique described above, is time consuming and subject to rapid tip wear. It interpolates width, so it assumes that width variation is uniform or can be modeled by a fixed polynomial order. It also assumes that both edges of the via are of symmetrically identical shape—an assumption that often is inaccurate. The interpolation procedure utilized by this technique also varies with the scans and, accordingly, does not have good repeatability.

In light of the foregoing, the need exists to measure a characteristic of a feature of a sample, such as a maximum or minimum width, rapidly and with high levels of repeatability and accuracy.

SUMMARY OF THE INVENTION

In accordance with a first aspect of the invention, the above-identified need is met by providing a measuring technique that obtains an SPM scan of a feature of interest in the Y and then fits a curve to a family of feature edge points developed as a result of that scan. A single curve can provide valuable information regarding line roughness or a similar characteristic. If two curves are fit to opposed edges of the feature of interest, the maximum or minimum distance between those curves can be determined to ascertain a dimension of interest such as a maximum via width, minimum line width, etc. The scan preferably is relatively low-resolution, including as few as 4 and typically about 15-30 scan profiles in the X direction per 1 um the Y direction. For a typical semiconductor feature having a height in the 150 to 300 nm range, the scan produces about 8 to 12 scan profiles passing through the feature. The resultant low-resolution scan can be performed relatively rapidly, potentially doubling the sample throughput when compared to the prior art utilizing high-resolution scans. It also significantly reduces tip wear when compared to high-resolution scans. The resulting measurements are also highly accurate and extremely repeatable. In fact, the characteristic dimension can be determined with three-$\sigma$ dynamic repeatability, i.e., of about 2 nanometers or less in most instances.

The curves are preferably second order polynomial curves fit by a weighted least squares regression technique. However, other polynomial functions and/or other curve fitting techniques could be employed depending, e.g., on designer preference and the characteristics of the feature being measured.

In accordance with another aspect of the invention, an AFM configured to perform the process described above is provided.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENTS

As discussed briefly in the Summary section above, a procedure performed in accordance with the first preferred embodiment of the invention involves taking an SPM scan of a portion of a sample surface containing a feature of interest, determining the location of at least one edge of the sample feature, and then fitting a curve to determine the location of that edge. The feature may be any change in topography or other mechanical property of the sample surface. A single curve can provide useful information concerning a characteristic feature, such as line edge roughness. If two curves are fit through determined locations on opposed edges of the feature, the maximum and/or minimum distances (known as "extreme distances") between those curves can be ascertained to obtain a precise measurement of a characteristic dimension such as maximum via width or minimum line width. When edge locations are ascertained on opposite sides of the feature, those edges are preferably located on a common horizontal plane of known depth so as to ensure that the determined distance has no vertical or Z component and, therefore, is an accurate representation of the true distance in the horizontal or XY plane.

Figure 1A:
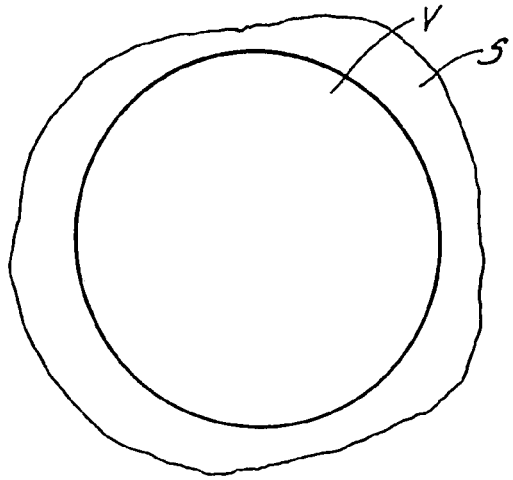
FIGS. 1A-1C are plan, side sectional, and a cutaway perspective views, respectively, of a semi-conductor via measurable in accordance with the present invention.
Figure 1B:
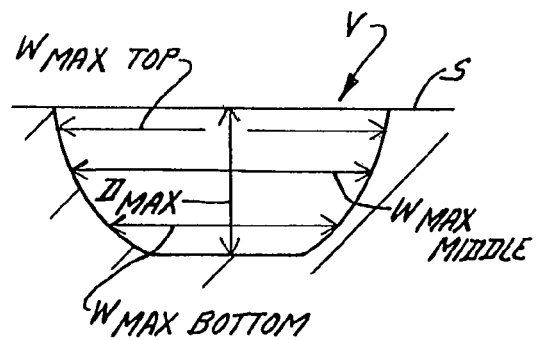
Figure 1C:
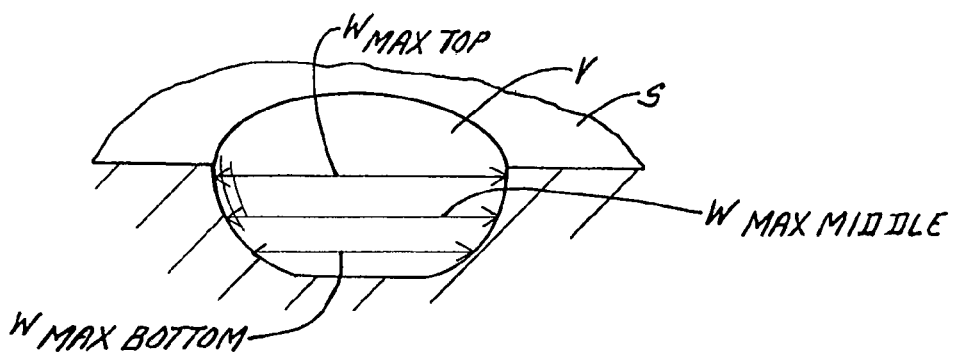
Figure 2A:
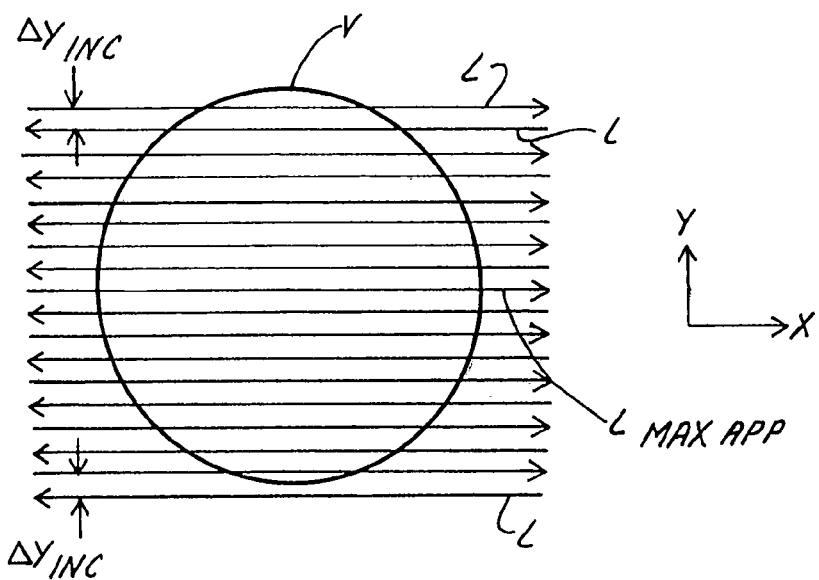
FIGS. 2A and 2B schematically illustrate the scanning of a characteristic feature of a sample in accordance with a prior art technique, appropriately labeled "PRIOR ART"
Figure 2B:
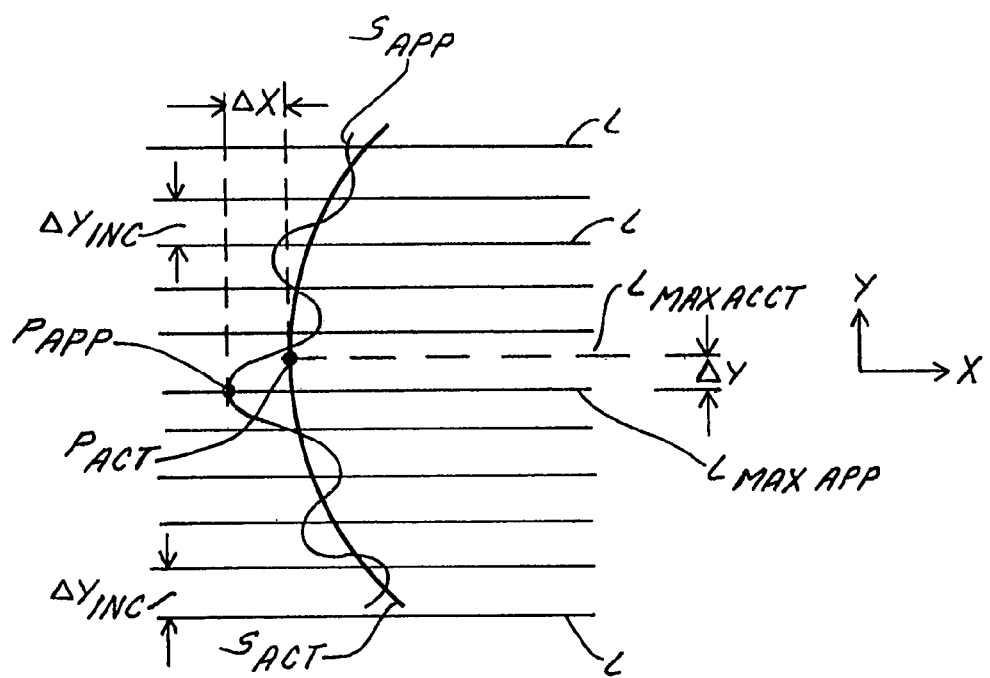
Figure 3A:
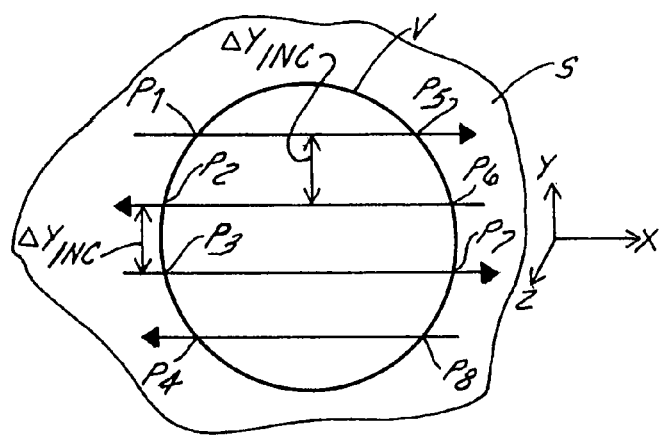
FIGS. 3A-3D schematically illustrates a procedure for determining a characteristic dimension of a sample feature in accordance with a preferred embodiment of the invention.
Figure 3B:
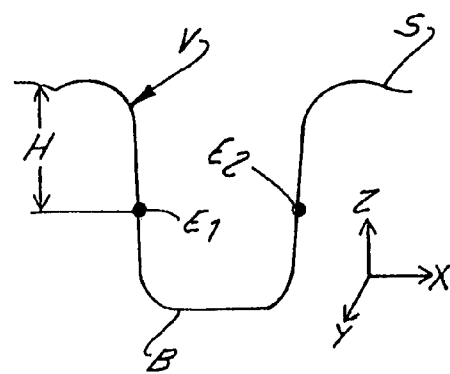
Figure 3C:
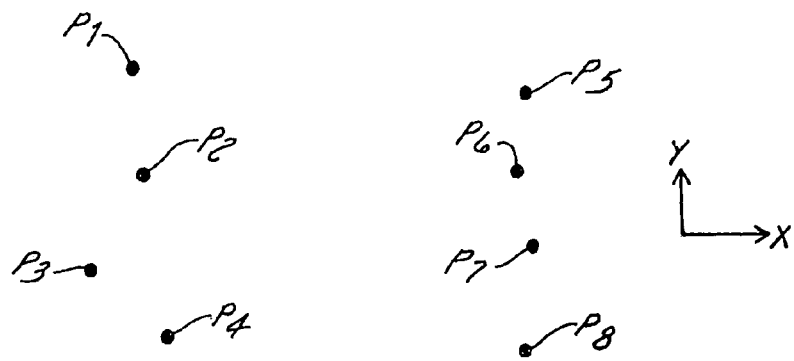

Referring initially to FIGS. 3A and 3B, a section of a semi-conductor wafer surface S is scanned that includes a feature of interest, in this case a via V. As is typical, the via V is generally circular in shape and has a maximum depth D and width W. The scan height may be user defined and is typically between 300 and 600 nm, but can vary considerably on either end of that range depending on, e.g., user preference and the height of the feature being scanned. For instance, it may be 1 micron high or even considerably higher. The scan density is also user defined and tends to increase with decreased feature height in order to assure that at least 4, and preferably about 8-12, scan profiles cross the feature of interest. A scan profile generally consists of an array of measurements of one or more properties of a surface in a localized area. Usually a scan profile consists of a series of measurements performed along a single scan line, that is, linearly aligned across a portion of a sample. A scan profile can, however, have an arbitrary shape. Such scan profiles can be arranged, for example, to intersect a larger number of sample features that are not necessarily on the same line.

In order to maximize throughput and increase accuracy, the preferred scan density is less than, and more preferably about half that, typically employed by the prior art. For a 300-600 nm scan through a feature having a height of, e.g., 150-300 nm, the scan density is preferably about 15-30 scan profiles per micron, resulting in the desired 8-12 scan profiles passing through the feature. Prior techniques, on the other hand, typically had a scan density of about 35-60 scan profiles per micron on the same sized scan, typically resulting 16-32 scan profiles passing through the feature. Throughput therefore is roughly doubled low-resolution Data is preferably collected in the so-called "CD" mode which, as discussed above, concentrates the data points in areas of changing topography, in this case the opposite sidewalls $W_1$ and $W_2$ of the via V. Everything else being equal, at least about twice as many samples can be measured per hour using a scan having low-resolution in the Y direction, as compared with the prior art techniques that require a high-resolution scan.

Once the data is collected, the location of scanned points P1-P8 on two opposed edges $E_1$ and $E_2$ of the feature are identified in a common reference location. An "edge" in this regard is the X or fast scan value at a defined reference location. The reference location may be a reference Z plane or a specific vertical absolute percentage offset from the top or bottom of the sample. It also could take the form of a slope threshold of the feature. If a Z plane is selected as the reference location, it is selected by selecting a designated, even arbitrary height H at a fixed distance either below the surface S of the via V or above the bottom B of the via V. Both of these locations are known as a result of the scan operation. It should be emphasized that the magnitude of the height H is somewhat arbitrary and may be user defined. The process may be repeated at more than one height H. Indeed, the process could be repeated for any desired number of heights to ascertain a range of minimum or maximum distances at various locations along the via V. For instance, the procedure could be performed at the top, middle, and bottom portions of the via V to provide results at three levels over the depth of the via, yet still maintain the throughput advantages of the preferred embodiments.

Figure 3D:
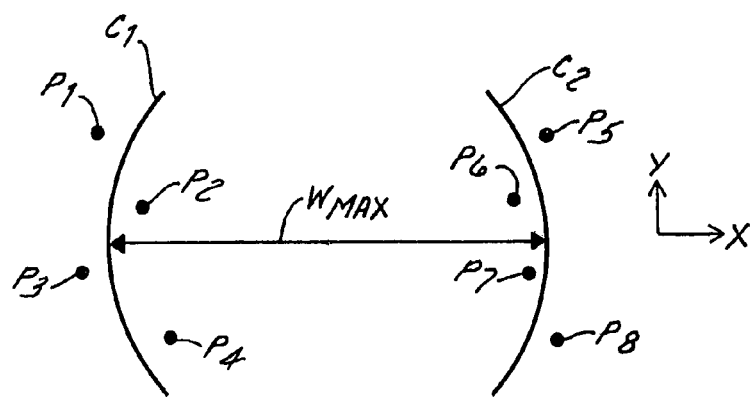

Once the edge points $P_1$-$P_8$ on each side of the feature of interest are selected, a separate curve C1, C2 is fit through each of the points as illustrated in FIG. 3D to report the changes in the corresponding edges $E_1$ and $E_2$. The curves C1 and C2 will have a polynomial form. In the case of a via mapped by an AFM, each curve will take the form of a parabola rather than a circle. This is because an AFM tip scanning a circular feature makes an ellipse or parabola rather than a circle due to the manner in which the probe tip tracks the surface during a scan operation.

It is assumed at this point that the curves C1 and C2 each have an axis that is aligned to the scan direction or parallel to the X axis in the figures. This assumption permits the curve to be fit using only Y as a variable. If that assumption proves not to be correct, each curve could be fit with a full two-dimensional quadratic form. The resulting process is more complex than the one described above, but within the capabilities of those familiar with curve fitting techniques.

Any suitable curve fitting technique may be used to define the respective parabolic curves C1 and C2. One suitable, but by no means the only possible curving fitting technique, is the so-called "weighted least curves" regression technique. Weighted least squares reflect the behavior of the random errors in the model; and it can be used with functions that are either linear or nonlinear in the parameters. With this technique, extra nonnegative constants, or weights, associated with each data point are incorporated into the fitting criterion. The magnitude of the weight indicates the precision of the information contained in the associated observation. Optimizing the weighted fitting criterion to find the parameter estimates allows the weights to determine the contribution of each observation to the final parameter estimates. The weight for each observation is given relative to the weights of the other observations. Different sets of absolute weights therefore can have identical effects.

The curve fitting operation will derive two parabolic equations $C1_x$ and $C2_x$ having the following formula:

$$C1(X) = a1Y^2 + b1Y + c1 \quad \text{Equation 1}$$

$$C2(X) = a2Y^2 + b1X + c1 \quad \text{Equation 2}$$

The distance D(X) between the two curves in any location along the Y direction of the via may be expressed as:

$$D(X) = C2(X) - C1(X) = (a2-a1)Y^2 + (b2-b1)Y + (c2-c1) \quad \text{Equation 3}$$

At a maximum or minimum distance between the two curves, the derivative of this equation will be zero. Hence:

$$D'(X) = 2Y(a2-a1)Y + (b2-b1) = 0 \quad \text{Equation 4}$$

Hence, the maximum via width $X_m$ can be reflected by:

$$\text{maximum Distance } X_m = -(b2-b1)/(a2-a1) \quad \text{Equation 5}$$

Since a1, a2, b1, and b2 are known from the curve fitting operation, $X_m$ can be readily determined.

Figure 4:
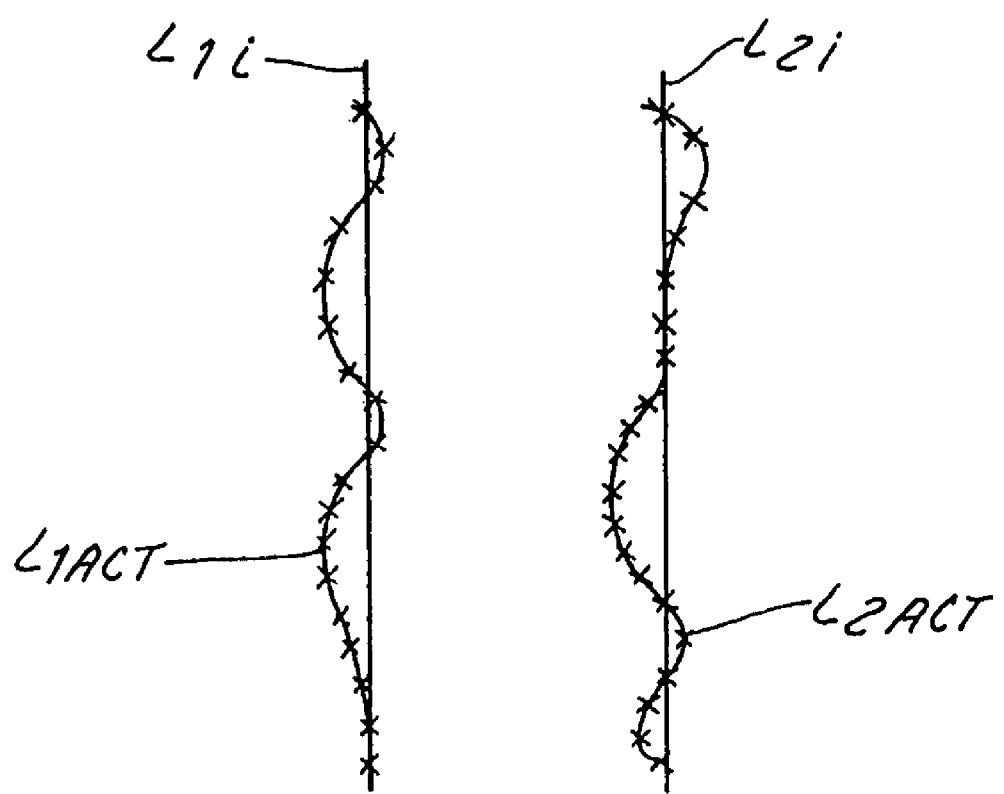
FIG. 4 schematically illustrates a technique for measuring line roughness in accordance with a preferred embodiment of the present invention.

The basic technique described above can also be used to measure line edge roughness, sometimes called "sidewall roughness." Line edge roughness is the deviation when viewed in top plan, of the edges of a semiconductor line from an ideal or profile. Referring to FIG. 4, the opposed edges $L1_i$ and $L2_i$ of the illustrated hypothetical line L should ideally be of a specified shape, such as a straight line. In the illustrated hypothetical example, they are straight as shown. However, the actual edges, $L_{1ACT}$ and $L_{2ACT}$ deviate from the ideal shape. In the illustrated example, they are curved or rippled. It is desirable to know the magnitude of these deviations.

This magnitude can be determined by collecting data points at a particular height along the edge of a line, and fitting a curve to those points using the curve fitting procedure described above or any other suitable curve fitting procedure. That curve may take the form of a parabola as described above or may take the form of a higher order polynomial. Once the curve is fit, line edge roughness can be measured by characterizing deviations of the actual line edge from the fit curve.

In addition to being relatively fast, the technique described above is relatively insensitive to noise and, accordingly, highly repeatable because the curve fitting process tends to act as a filter to the acquired data. In fact, the characteristic dimension can be determined with three-a dynamic repeatability of less than about 2 nm in most instances. That repeatability is much less sensitive to scan density than with the SXM and IBM methods described above. Actual repeatability from 3 different data sets is reflected in Table 1:

TABLE 1

| | Repeatability (nm) | | |
|---|---|---|---|
| | Top Width | Middle Width | Bottom Width |
| Data set 1 | | | |
| SXM method | 2.76 | 0.81 | 0.83 |
| IBM method | 3.14 | 1.06 | 0.76 |
| Via | 1.30 | 0.76 | 0.62 |
| Data set 2 | | | |
| SXM method | 2.90 | 2.48 | 1.88 |
| IBM method | 1.97 | 2.04 | 1.36 |
| Via | 1.30 | 1.43 | 1.12 |
| Data set 3 | | | |
| SXM method | 5.13 | 3.55 | 3.57 |
| Via | 2.41 | 2.37 | 1.94 |

Figure 5:
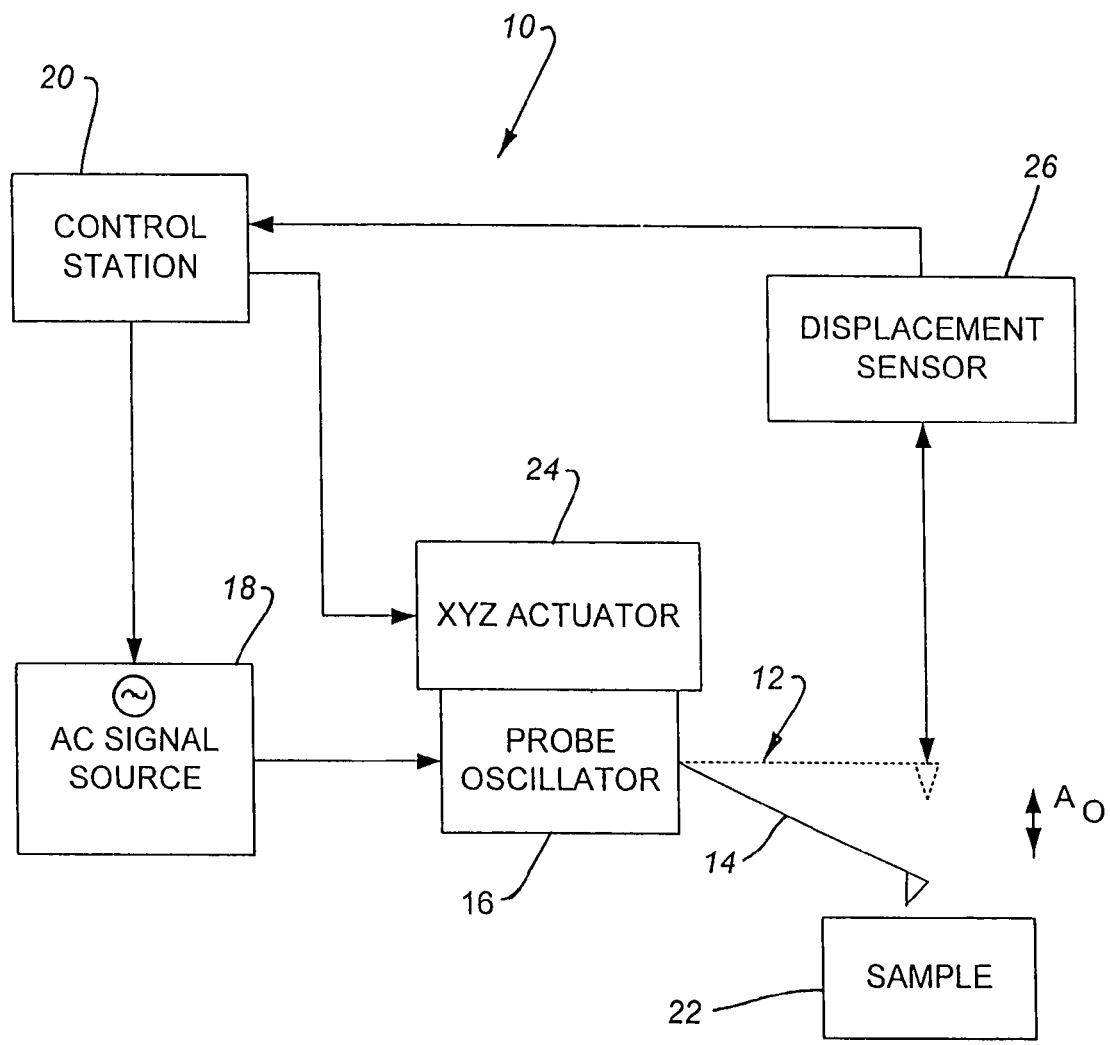
FIG. 5 schematically illustrates an AFM configured to implement the procedure of FIGS. 3 and 4.

An AFM that is capable of implementing the techniques described above is illustrated in FIG. 5. The AFM includes a probe device mounted over a sample 22. The probe device includes at least a probe 12 having a cantilever 14 and a tip 16 mounted on the free end portion of the cantilever 14. The probe device is coupled to an oscillating actuator or drive 16 that is used to drive probe 12 to oscillate, in this case, at or near the probe's resonant frequency. Commonly, an electronic signal is applied from an AC signal source 18 under control of an AFM control station 20 to the drive 16 to oscillate probe 12, preferably at a free oscillation amplitude $A_o$. Control station 20 typically consists of at least one computer and associated electronics and software that perform the tasks of data acquisition and control of the AFM. The control station 20 may consist of a single integrated unit, or may consist of a distributed array of electronics and software. The control station may use a typical desktop computer, a laptop computer, an industrial computer and/or one or more embedded processors.

Probe 12 can also be actuated to move toward and away from sample 22 using a suitable actuator or scanner 24 controlled via feedback by control station 20. The oscillating drive 16 may be coupled to the scanner 24 and probe 12 but may be formed integrally with the cantilever 14 of probe 12 as part of a self-actuated cantilever/probe. Moreover, though the actuator 24 is shown coupled to the probe, the actuator 24 or a portion of it may be employed to move sample 22 in three orthogonal directions as an X Y Z actuator.

In operation, as the probe 12 is oscillated and brought into contact with sample 22, sample characteristics can be monitored by detecting changes in the oscillation of probe 12. In particular, a beam (not shown) is directed towards the backside of probe 12 which is then reflected towards a detector 26, such as a four quadrant photodetector. As the beam translates across the detector, appropriate signals are transmitted to control station 20 which processes the signals to determine changes in the oscillation of probe 12. Control station 20 typically generates control signals to maintain a constant force between the tip 16 and the sample, typically to maintain a setpoint characteristic of the oscillation of probe 12. For example, control station 20 is often used to maintain the oscillation amplitude at a setpoint value, $A_S$, to insure a generally constant force between the tip 16 and the sample. Alternatively, a setpoint phase or frequency may be used. A workstation is also provided that receives the collected data from the control station 20 and manipulates the data obtained during scanning to perform the point selection, curve fitting, and distance determining operations described above. That workstation may be the control station 20 itself, a separate on-board controller, a separate off-board controller, or any combination of the three. If the workstation is formed from a combination of two or more controllers, they are preferably connected to one another, e.g., by hardwiring or via an Ethernet connection.

Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept. The scope of still other changes to the described embodiments that fall within the present invention but that are not specifically discussed above will become apparent from the appended claims and other attachments.

We claim:

1. A method of measuring a characteristic of a sample feature, the method comprising:
    (A) acquiring a plurality of scanning probe microscope (SPM) scan profiles of at least a portion of the sample;

(B) determining the location of at least one edge of a feature of the sample;

(C) fitting a curve through the determined location of the edge, wherein the determining step comprises determining locations of first and second edges of the feature, and the fitting step comprises fitting first and second curves through the determined locations of the first and second edges; and further comprising, determining an extreme distance between the first and second curves.

2. The method of claim 1, wherein the location of the first and second edges are in a common substantially horizontal plane.

3. The method of claim 1, wherein the sample characteristic comprises at least one of a via, a gap, and a line, and further comprising determining at least one of a maximum width of the via, a maximum width of the gap, and a minimum width of the line.

4. A method of measuring a characteristic of a sample feature, the method comprising:
(A) acquiring a plurality of scanning probe microscope (SPM) scan profiles of at least a portion of the sample;
(B) determining the location of at least one edge of a feature of the sample;
(C) fitting a curve through the determined location of the edge,
wherein the surface feature is one of a via, a gap, a line, and a trench, and
further wherein the surface feature is a line, the location of the edge is a line edge, the fitting step comprises fitting a curve through the line edge, and further comprising determining line edge roughness by characterizing deviations of the fit curve from an ideal line edge.

5. The method of claim 4, wherein a curve fitting the polynomial equation has a major axis that is at least substantially parallel with the scan profiles.

6. A method of measuring a characteristic of a sample feature, the method comprising:
(A) acquiring a plurality of scanning probe microscope (SPM) scan profiles of at least a portion of the sample;
(B) determining the location of at least one edge of a feature of the sample;
(C) fitting a curve through the determined location of the edge,
wherein the acquiring step produces scan profiles that extend in an X direction and that are spaced in a Y direction that is perpendicular to the X direction, and where the acquiring step has a scan density of no more than 30 scan profiles per μm in the Y direction.

7. The method of claim 6, wherein the acquiring step has a scan density of no more than 8 scan profiles per μm in the Y direction.

8. A method of measuring a characteristic of a sample feature, the method comprising:
(A) acquiring a plurality of scanning probe microscope (SPM) scan profiles of at least a portion of the sample;
(B) determining the location of at least one edge of a feature of the sample;
(C) fitting a curve through the determined location of the edge,
wherein the acquiring step takes no more than 12 scan profiles extending through the feature.

9. The method of claim 1 wherein the acquiring step is performed in a critical dimension mode of SPM imaging.

10. A method of measuring a characteristic of a sample feature, the method comprising:

(A) acquiring a plurality of scanning probe microscope (SPM) scan profiles of at least a portion of the sample;
(B) determining the location of at least one edge of a feature of the sample;
(C) fitting a curve through the determined location of the edge,
wherein the method produces measurements with a three sigma repeatability of less than about 2.0 nm.

11. The method of claim 10, wherein the method produces measurements with a three sigma repeatability of less than about 1.3 nm.

12. A method comprising:
determining a distance between first and second curves fit through locations on first and second edges of a feature of a sample, the locations being determined by acquiring a plurality of scanning probe microscope (SPM) scan profiles, wherein the locations are determined by performing a scan having a number of scan profiles that extend in an X direction and that have a scan density of no more than 30 scan profiles per μm in a Y direction perpendicular to the X direction.

13. The method of claim 12, wherein the scan has a scan density of no more than 15 scan profiles per μm in the Y direction.

14. A method comprising:
determining a distance between first and second curves fit through locations on first and second edges of a feature of a sample, the locations being determined by acquiring a plurality of scanning probe microscope (SPM) scan profiles, wherein the locations are determined by performing a scan having no more than 12 scan profiles passing through the feature of interest.

15. A method comprising:
determining a distance between first and second curves fit through locations on first and second edges of a feature of a sample, the locations being determined by acquiring a plurality of scanning probe microscope (SPM) scan profiles, wherein the method produces measurements with a three sigma repeatability of less than about 2.0 nm.

16. A method of measuring a characteristic dimension of a feature of a semiconductor measured by scanning probe microscopy, the feature comprising one of a via, a line, and a trench, the method comprising:
(A) acquiring a plurality of scanning probe microscope (SPM) scan profiles of a portion of a surface of the semiconductor containing the features of interest, wherein no more than 12 scan profiles pass through the feature;
(B) determining locations of first and second edges of the feature;
(C) fitting first and second curves through the determined locations of the first and second edges by fitting data from the acquired scan profiles to a polynomial equation; and
(D) measuring the characteristic dimension by determining an extreme distance between the first and second curves by determining locations on the curves at which a derivative of each of the polynomial equations is substantially zero.

17. A scanning probe microscope (SPM), comprising:
(A) a probe that is scanned relative to a sample;
(B) an SPM control station that receives data from the probe and that;
i. acquires a plurality of SPM scan profiles of the sample;
ii. determines the location of at least one edge of a feature of the sample, and iii. fits a curve through the determined location of the edge, wherein the control station determines locations of first and second edges of the feature, fits first and second curves through the determined locations of the first and second edges, and determines an extreme distance between the first and second curves.

18. The SPM of claim 17 wherein the SPM is an automatic force microscope (AFM).

19. The SPM of claim 17 wherein the control station fits data from the acquired scan profiles to a polynomial equation.

20. The SPM of claim 19, wherein the polynomial equation has the following form:

$$C1(X) = a1Y^2 + b1Y + c1.$$

21. A scanning probe microscope (SPM), comprising:

(A) a probe that is scanned relative to a sample;

(B) an SPM control station that receives data from the probe and that;

i. acquires a plurality of SPM scan profiles of the sample;

ii. determines the location of at least one edge of a feature of the sample, and iv. fits a curve through the determined location of the edge, wherein the SPM acquires data at a scan density of no more than 30 scan profiles in an X direction per μm in a Y direction that is perpendicular to the X direction.

22. The SPM of claim 17 wherein the SPM acquires data in critical dimension mode.

23. The method of claim 12 further comprising measuring an extreme dimension of a sample surface feature.

24. The method of claim 23, wherein the extreme dimension comprises at least one of wherein the sample includes at least one of a maximum width of a via, a maximum width of a gap, and a minimum width of a line.

25. The method of claim 23, further comprising at least one of storing and displaying information concerning the extreme dimension.

26. The SPM of claim 17 wherein the SPM control station at least one of stores and displaying information concerning a characteristic of the sample feature.

* * * * *